(12) United States Patent
Hsu et al.

(10) Patent No.: US 8,957,506 B2
(45) Date of Patent: Feb. 17, 2015

(54) QUAD FLAT NON-LEADED PACKAGE

(75) Inventors: Yueh-Liang Hsu, Taichung (TW); Chi-Wen Chang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 797 days.

(21) Appl. No.: 12/578,749

(22) Filed: Oct. 14, 2009

(65) Prior Publication Data
US 2010/0219518 A1  Sep. 2, 2010

(30) Foreign Application Priority Data

Feb. 27, 2009 (TW) .............................. 98106482 A

(51) Int. Cl.
*H01L 23/495* (2006.01)
*H01L 23/00* (2006.01)
*H01L 23/31* (2006.01)

(52) U.S. Cl.
CPC ...... *H01L 23/49548* (2013.01); *H01L 23/4951* (2013.01); *H01L 24/49* (2013.01); *H01L 23/3107* (2013.01); *H01L 2224/48091* (2013.01); *H01L 2224/48247* (2013.01); *H01L 2224/49171* (2013.01); *H01L 2924/01082* (2013.01); *H01L 2924/14* (2013.01); *H01L 24/48* (2013.01)
USPC ....................................................... 257/666

(58) Field of Classification Search
CPC ................................................ H01L 23/49541
USPC .................................. 257/666, 676; 438/123
See application file for complete search history.

(56) References Cited

U.S. PATENT DOCUMENTS

| | | | |
|---|---|---|---|
| 7,161,232 B1 * | 1/2007 | Lee et al. ........................ | 257/676 |
| 7,298,026 B2 * | 11/2007 | Shim et al. .................... | 257/666 |
| 7,667,309 B2 * | 2/2010 | Harnden et al. ............... | 257/676 |
| 7,911,067 B2 * | 3/2011 | Camacho et al. ............. | 257/783 |
| 2003/0189222 A1 | 10/2003 | Itou et al. ...................... | 257/200 |
| 2007/0034994 A1 | 2/2007 | Choi .............................. | 257/666 |
| 2008/0157299 A1 | 7/2008 | Holloway et al. ............. | 257/670 |
| 2008/0211069 A1 * | 9/2008 | Amano et al. ................. | 257/666 |

FOREIGN PATENT DOCUMENTS

TW           200709360           3/2007

OTHER PUBLICATIONS

Chinese First Examination Report of China Application No. 200910007967.1, dated Jan. 10, 2011.
"Office Action of China Counterpart Application", issued on Jun. 13, 2012, p. 1-p. 6.

* cited by examiner

*Primary Examiner* — Yu-Hsi D Sun
(74) *Attorney, Agent, or Firm* — Foley & Lardner LLP; Cliff Z. Liu; Angela D. Murch

(57) ABSTRACT

A quad flat non-leaded package including a leadframe, a chip, a plurality of first bonding wires and a molding compound is provided. The leadframe includes a plurality of first leads, and each first lead has a first portion and a second portion that extend along an axis. The length of the first portion is greater than the length of the second portion. The thickness of the first portion is greater than the thickness of the second portion. The chip is disposed on the leadframe and covers a portion of the first portions. The first bonding wires are connected between the chip and another portion of the first portions or the chip and the second portions, such that the chip is electrically connected to the first leads through the first bonding wires. The molding compound encapsulates a portion of the first leads, the chip and the first bonding wires.

10 Claims, 3 Drawing Sheets

QUAD FLAT NON-LEADED PACKAGE

CROSS-REFERENCE TO RELATED APPLICATION

This application claims the priority benefit of Taiwan application serial no. 98106482, filed on Feb. 27, 2009. The entirety of the above-mentioned patent application is hereby incorporated by reference herein and made a part of this specification.

BACKGROUND OF THE INVENTION

1. Field of the Invention

The present invention generally relates to a quad flat package (QFP), and more particularly, to a quad flat non-leaded (QFN) package.

2. Description of Related Art

The production of integrated circuits (IC) includes IC design, IC process and IC package. The package may prevent the chip from influence of external temperature and humidity, and from contamination of dust, and may provide an intermedium for connecting the chip to external circuits.

Chip package is categorized into various package types. Here, the quad flat non-leaded package belonging to the category of quad flat package and characterized by short signal transmission path and rapid signal transmission speed is suitable for high frequency (i.e. radio frequency bandwidth) chip package, and thus becomes one of the main options of low pin count package.

In a conventional manufacturing method of quad flat non-leaded package, chips are disposed on a leadframe. Next, the chips are electrically connected to the leadframe via bonding wires. Thereafter, a portion of the leadframe, the bonding wires, and the chips are encapsulated by a molding compound. Finally, the aforementioned structure is singularized through the punch process or the sawing process to form a plurality of quad flat non-leaded packages.

SUMMARY OF THE INVENTION

The present invention provides a quad flat non-leaded package, where a chip is disposed above a leadframe and covers a portion of leads, so that the leads can replace a die pad to reduce a package size.

The present invention provides a quad flat non-leaded package, where a first portion of a lead provides greater support for wire bonding process to enhance the reliability of the quad flat non-leaded package manufacturing.

The present invention provides a quad flat non-leaded package, which prevents two adjacent leads to result in electric connection in a singulation process so as to enhance the reliability of the quad flat non-leaded package.

One embodiment of the present invention provides a quad flat non-leaded package including a leadframe, a chip, a plurality of first bonding wires, and a molding compound. The leadframe includes a plurality of first leads, and each first lead has a first portion and a second portion. The first portion and the second portion extend along an axis. Moreover, the length of the first portion is greater than the length of the second portion, and the thickness of the first portion is greater than the thickness of the second portion. The chip is disposed on the leadframe and covers a portion of the first portions. The first bonding wires are connected between the chip and another portion of the first portions or the chip and the second portions, such that the chip is electrically connected to the first leads through the first bonding wires. The molding compound encapsulates a portion of the first leads, the chip, and the first bonding wires.

In one embodiment of the present invention, the leadframe further includes a plurality of second leads. The thickness of the second leads and the thickness of the first portions of the first leads are substantially the same, and the second leads and the first portions of the first leads are staggered.

In one embodiment of the present invention, the quad flat non-leaded package further includes a plurality of second bonding wires. The second bonding wires are connected between the chip and the second leads, so that the chip is electrically connected to the second leads through the second bonding wires.

In one embodiment of the present invention, the leadframe further includes a die pad. The chip is disposed on the die pad, and the first leads and the second leads are disposed surrounding the die pad. The size of the die pad is smaller than the size of the chip. The die pad not only supports the chip together with a portion of the first leads, but also has the heat dissipation effect.

In one embodiment of the present invention, the quad flat non-leaded package further includes an adhesion layer. The adhesion layer is disposed between the chip and the die pad, and the chip and the first portions of the first leads.

In one embodiment of the present invention, the first portion of one of the first leads is integrally formed with the die pad as a unit.

In one embodiment of the present invention, one of the first leads is a ground lead.

The present invention further provides a quad flat non-leaded package including a leadframe, a chip, a plurality of bonding wires, and a molding compound. The leadframe includes a plurality of leads, and each lead has a first portion and a second portion. In addition, the junction of the first portion and the second portion has a notch, where the first portion and the second portion extend along an axis. Here, a first distance between any two adjacent second portions is substantially greater than a second distance between any two adjacent first portions. The chip is disposed on the leadframe. The bonding wires are connected between the chip and the leadframe, so that the chip is electrically connected to the leads through the bonding wires. The molding compound encapsulates the chip and the bonding wires and is filled between the notches and the leads.

In one embodiment of the present invention, a first upper surface of the first portion and a second upper surface of the second portion of each lead are substantially in-plane. Moreover, the thickness of the first portion is greater than the thickness of the second portion, so that a containing space is defined by a lower surface of the second portion and a side surface of the first portion adjacent to the lower surface of the second portion. Here, the molding compound is filled in the containing space.

In one embodiment of the present invention, the length of the second portion of each lead is greater than or equal to 50 μm, and smaller than the length of the first portion of each lead.

In one embodiment of the present invention, the aforementioned leads are staggered.

In one embodiment of the present invention, the leadframe further includes a die pad. The chip is disposed on the die pad, and the leads are disposed surrounding the die pad.

In light of the foregoing, in the above-mentioned embodiments of the present invention, the first portion and the second portion of each first lead extend along an axis. Also, the length of the first portion is greater than the length of the second portion, and the thickness of the first portion is greater than the thickness of the second portion. Therefore, when the chip is electrically connected to the first portions of the first leads through the first bonding wires, not only is the length of the bonding wires reduced, but the first portions can also provide greater support for wire bonding process. Hence, the quad flat non-leaded package manufacturing has a better reliability.

In addition, as the distance between any two adjacent second portions is substantially greater than the distance between any two adjacent first portions, the second portions of two adjacent leads are prevented from resulting in electric connection in the singulation process. Therefore, the reliability of the quad flat non-leaded package can be enhanced.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
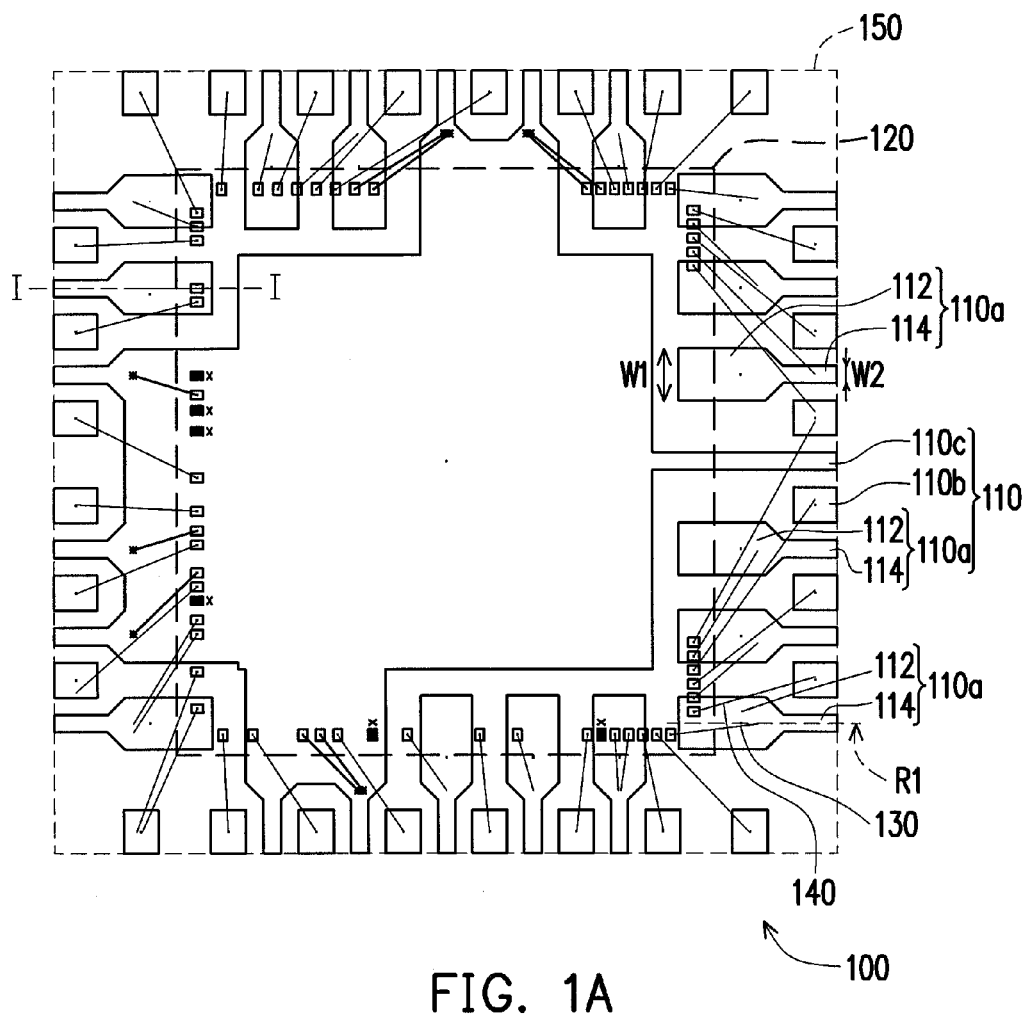
FIG. 1A is a schematic top view of a quad flat non-leaded package according to an embodiment of the present invention.
Figure 1B:
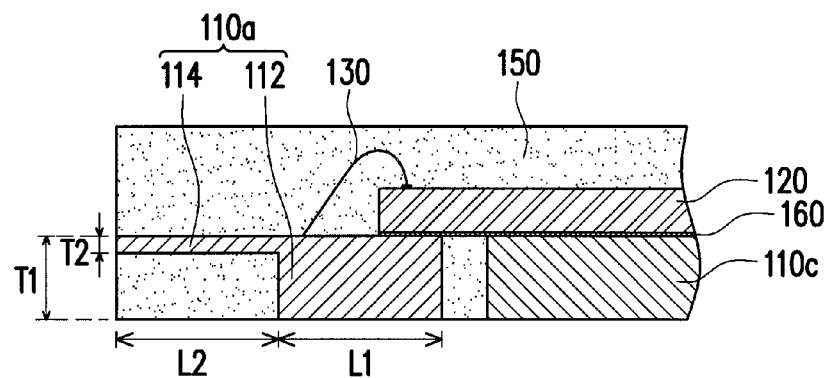
FIG. 1B is a schematic cross-sectional view taken along line I-I in FIG. 1A.

FIG. 1A is a schematic top view of a quad flat non-leaded package according to an embodiment of the present invention. FIG. 1B is a schematic cross-sectional view taken along line I-I in FIG. 1A. In order to facilitate explanation, a chip 120 and a molding compound 150 in FIG. 1A are both represented in dashed lines. Referring to FIG. 1A and FIG. 1B simultaneously, in the present embodiment, a quad flat non-leaded package 100 includes a leadframe 110, a chip 120, a plurality of first bonding wires 130, and a molding compound 150.

In details, the leadframe 110 includes a plurality of first leads 110a, and each first lead 110a has a first portion 112 and a second portion 114. The first portion 112 and the second portion 114 extend along an axis R1. A length L1 of the first portion 112 is greater than a length L2 of the second portion 114. A thickness T1 of the first portion 112 is greater than a thickness T2 of the second portion 114. Moreover, a width W1 of the first portion 112 is greater than a width W2 of the second portion 114. In the present embodiment, the length of the second portion 114 of the first lead 110a can be smaller than 400 μm.

In the present embodiment, the leadframe 110 further includes a plurality of second leads 110b and a die pad 110c. Here, the first leads 110a and the second leads 110b are disposed surrounding the die pad 110c. Moreover, the first portion 112 of one of the first leads 110a is integrally formed with the die pad 110c as a unit. That is, the first portions 112 of the first leads 110a are closer to the die pad 110c in comparison with that of the second portions 114. The first leads 110a that are integrally formed with the die pad 110c as a unit are ground leads. More specifically, the thickness of the second leads 110b and the thickness T1 of the first portions 112 of the first leads 110a are substantially the same, and the second leads 110b and the first portions 112 of the first leads 110a are staggered. In other words, the second leads 110b and the second portions 114 of the first leads 110a are alternately arranged. In short, the first leads 110a and the second leads 110b of the leadframe 110 are arranged in multiple rows and disposed surrounding the die pad 110c. That is, the design of the leadframe 110 in the present embodiment increases the number of rows for arranging the leads.

The chip 120 is disposed on the die pad 110c of the leadframe 110 and covers a portion of the first portions 112 of the first leads 110a. Here, the size of the die pad 110c is smaller than the size of the chip 120. The die pad 110c not only supports the chip 120 together with a portion of the first portions 112 of the first leads 110a, but also has the heat dissipation effect. The first bonding wires 130 are connected between the chip 120 and another portion of the first portions 112 of the first leads 110a, such that the chip 120 is electrically connected to the first leads 110a through the first bonding wires 130. In the present embodiment, the quad flat non-leaded package 100 further includes a plurality of second bonding wires 140. The second bonding wires 140 are connected between the chip 120 and the second leads 110b, so that the chip 120 is electrically connected to the second leads 110b through the second bonding wires 140. The molding compound 150 encapsulates a portion of the first leads 110a, the second leads 110b, the chip 120, the first bonding wires 130, and the second bonding wires 140.

In addition, the quad flat non-leaded package 100 of the present embodiment further includes an adhesion layer 160. The adhesion layer 160 is disposed between the chip 120 and the die pad 110c, and the chip 120 and the first portions 112 of the first leads 110a for enhancing the adhesion between the chip 120, the die pad 110c, and the first leads 110a. In the present embodiment, the material of the adhesion layer 160 is epoxy.

In short, the length L1 of the first portion 112 of the first lead 110a is greater than the length L2 of the second portion 114 of the first lead 110a, and the thickness T1 of the first portion 112 of the first lead 110a is greater than the thickness T2 of the second portion 114 of the first lead 110a. Therefore, when the first bonding wires 130 are connected between the chip 120 and the first portions 112 of the first leads 110a, not only is the length of the first bonding wires 130 reduced, but the first portions 112 can also provide greater support for bonding the first bonding wires 130. Hence, manufacturing of the quad flat non-leaded package 100 in the present embodiment has a better reliability.

Figure 2A:
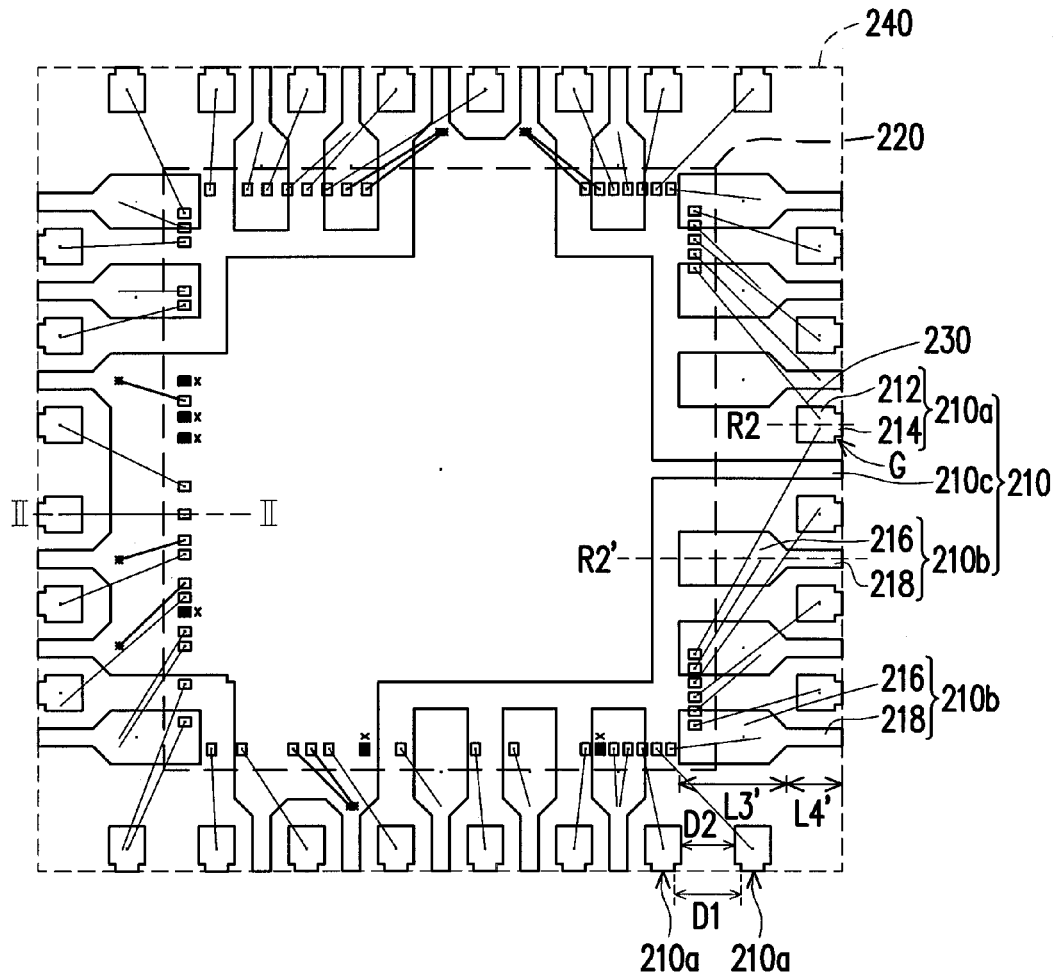
FIG. 2A is a schematic top view of a quad flat non-leaded package according to another embodiment of the present invention.
Figure 2B:
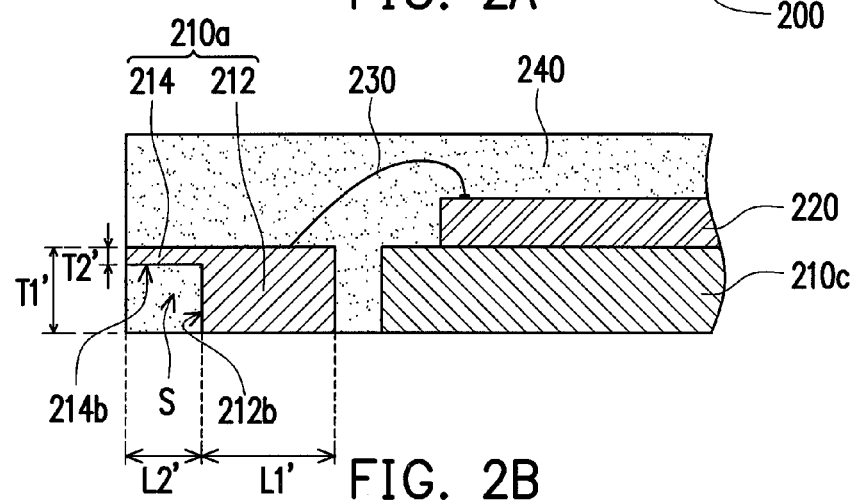
FIG. 2B is a schematic cross-sectional view taken along line II-II in FIG. 2A.
Figure 2C:
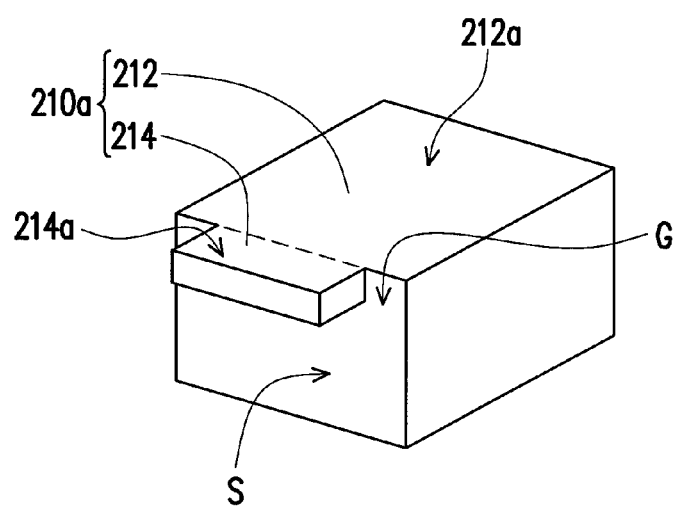
FIG. 2C is an enlarged schematic perspective view of a first lead of the quad flat non-leaded package in FIG. 2A.

FIG. 2A is a schematic top view of a quad flat non-leaded package according to another embodiment of the present invention. FIG. 2B is a schematic cross-sectional view taken along line II-II in FIG. 2A. FIG. 2C is an enlarged schematic perspective view of a first lead of the quad flat non-leaded package in FIG. 2A. In order to facilitate explanation, a chip 220 and a molding compound 240 in FIG. 2A are both represented in dashed lines. Referring to FIG. 2A, FIG. 2B, and FIG. 2C simultaneously, in the present embodiment, a quad flat non-leaded package 200 includes a leadframe 210, a chip 220, a plurality of bonding wires 230, and a molding compound 240.

More specifically, the leadframe 210 includes a plurality of first leads 210a and a plurality of second leads 210b. Here, the first leads 210a and the second leads 210b are staggered, and the material of the leadframe 210 is metal, for instance. Each first lead 210a includes a first portion 212 and a second portion 214. In addition, the junction of each first portion 212 and the corresponding second portion 214 has a notch G, where the first portion 212 and the second portion 214 extend along an axis R2. Moreover, a first distance D1 between any two adjacent second portions 214 is substantially greater than a second distance D2 between any two adjacent first portions 212. Each second lead 210b has a third portion 216 and a fourth portion 218. The third portion 216 and the fourth portion 218 extend along an axis R2'.

Since the first distance D1 between any two adjacent second portions 214 is substantially greater than the second distance D2 between any two adjacent first portions 212, the electric connection of the second portions 214 of two adjacent first leads 210a can be prevented. Specifically, a second portion 214 is prevented from being connected to another second portion 214 or a fourth portion 218 through the metal material remained on the tools in the singulation process, which consequently results in electric connection. Therefore, the quad flat non-leaded package 200 in the present embodiment has a better reliability.

In the present embodiment, a length L2' of the second portion 214 of each first lead 210a can be greater than or equal to 50 μm, and the length L2' of the second portion 214 of each first lead 210a is smaller than a length L1' of the first portion 212 of each first lead 210a. Here, the length of the first portion 212 can be about 200 μm. A length L3' of the third portion 216 of each second lead 210b is greater than a length L4' of the fourth portion 218. Referring to FIG. 2A, the length L4' of the fourth portion 218 of the second lead 210b can be smaller than 400 μm.

The leadframe 210 of the quad flat non-leaded package 200 further includes a die pad 210c. The first leads 210a and the second leads 210b are disposed surrounding the die pad 210c. Moreover, the third portion 216 of one of the second leads 210b and the die pad 210c are integrally formed as a unit. In other words, the third portions 216 of the second leads 210b are closer to the die pad 210c in comparison with that of the fourth portions 218. The chip 220 is disposed on the die pad 210c of the leadframe 210. The bonding wires 230 are connected between the chip 220 and the leadframe 210, such that the chip 220 is electrically connected to the first leads 210a and the second leads 210b through the bonding wires 230. The molding compound 240 encapsulates the chip 220 and the bonding wires 230, and is filled between the notches G, the first leads 210a, and the second leads 210b.

Specially, in the present embodiment, a first upper surface 212a of the first portion 212 of each first lead 210a and a second upper surface 214a of the second portion 214 are substantially in-plane. Moreover, the thickness T1' of the first portion 212 is greater than the thickness T2' of the second portion 214. Therefore, a containing space S is defined by a lower surface 214b of the second portion 214 and a side surface 212b of the first portion 212 adjacent to the lower surface 214b of the second portion 214. The molding compound 240 is filled in the containing space S.

Since a containing space S is defined by the lower surface 214b of the second portion 214 and the side surface 212b of the first portion 212, and the molding compound 240 is filled in the containing space S, peeling or delamination between the leadframe 210 and the molding compound 240 do not occur easily when an external force is exerted. Therefore, the quad flat non-leaded package 200 in the present embodiment has a better reliability.

In summary, in the above-mentioned embodiment of the present invention, the leadframe increases the number of rows for arranging leads through the staggering of leads. That is, the quad flat non-leaded package has the design of multiple row lead arrangement. Besides, as the length of the first portions is greater than the length of the second portions of the leads, and the thickness of the first portions is greater than the thickness of the second portions, when the chip is electrically connected to the first portions of the leads through the bonding wires, not only can the length of the bonding wires be reduced, but the first portions can also provide a greater support for wire bonding process. Hence, the quad flat non-leaded package has a better reliability.

Also, as the distance between any two adjacent second portions is substantially greater than the distance between any two adjacent first portions, the electric connection between the second portions of two adjacent leads can be prevented in the singulation process. Moreover, the molding compound is filled in the containing space defined by the second portion and the first portion, thus peeling or delamination between the leadframe and the molding compound do not occur easily when an external force is exerted. Hence, the quad flat non-leaded package has a better reliability.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A quad flat non-leaded package, comprising:
   a leadframe, comprising a plurality of first leads each having a lead length, and each of the first leads having a first portion and a second portion, wherein the first portion and the second portion extend along an axis, the second portion is farther away from the chip than the corresponding first portion, a length of the first portion is greater than a length of the second portion, the sum of the length of the first portion and the length of the second portion is the lead length, a thickness of the first portion is greater than a thickness of the second portion, and the thickness of the first portion is uniform;
   a chip, disposed on the leadframe and only covering a portion of the first portions without covering the second portions;
   a plurality of first bonding wires, connected between the chip and another portion of the first portions, or between the chip and the second portions for electrically connecting the chip to the first leads through the first bonding wires; and
   a molding compound, encapsulating a portion of the first leads, the chip, and the first bonding wires.

2. The quad flat non-leaded package as claimed in claim 1, wherein the leadframe further comprises a plurality of second leads, a thickness of the second leads and a thickness of the first portions of the first leads are substantially the same, and the second leads and the first portions of the first leads are staggered.

3. The quad flat non-leaded package as claimed in claim 2, further comprising:
   a plurality of second bonding wires, connected between the chip and the second leads for electrically connecting the chip to the second leads through the second bonding wires.

4. The quad flat non-leaded package as claimed in claim 2, wherein the leadframe further comprises a die pad, the chip is disposed on the die pad, and the first leads and the second leads are disposed surrounding the die pad.

5. The quad flat non-leaded package as claimed in claim 4, further comprising an adhesion layer disposed between the chip and the die pad, and also between the chip and the first portions of the first leads.

6. The quad flat non-leaded package as claimed in claim 4, wherein the first portion of one of the first leads and the die pad are integrally formed as a unit.

7. The quad flat non-leaded package as claimed in claim 6, wherein one of the first leads is a ground lead.

8. A quad flat non-leaded package, comprising:

a leadframe, comprising a plurality of first leads and a plurality of the second leads, the first leads and the second leads being staggered in an outer tier and inner tier respectively, wherein the inner tier extends further into the leadframe than the outer tier, each of the first and second leads having a first portion and a second portion, and a junction of the first portion and the second portion of each first lead having a notch, wherein the first portion and the second portion of each first lead extend along an axis, and first distance between any two adjacent second portions is substantially greater than a second distance between any two adjacent first portions;

a chip, disposed on the leadframe;

a plurality of bonding wires, connected between the chip and the leadframe for electrically connecting the chip to the first leads and the second leads through the bonding wires; and a molding compound, encapsulating the chip and the bonding wires and filled between the notches, and the leads and the second leads, and filled in the notch, wherein the second portion of each first lead is farther away from the chip than the corresponding first portion, a first upper surface of the first portion and s second upper surface of the second portion of each first lead are substantially in-plane, and a thickness of the first portion of each first lead is greater than a thickness of the corresponding second portion, so that a containing space is defined by a lower surface of the second portion of each first lead and a side surface of the corresponding first portion adjacent to the lower surface of the second portion, and the molding compound is filled in the containing space.

9. The quad flat non-leaded package as claimed in claim 8, wherein a length of the second portion of each of the first leads is greater than or equal to 50 μm and smaller than a length of the first portion of each first lead.

10. The quad flat non-leaded package as claimed in claim 8, wherein the leadframe further comprises a die pad, the chip is disposed on the die pad, and the first leads and the second leads are disposed surrounding the die pad.

* * * * *